US 6,559,736 B2

(12) United States Patent
Lu et al.

(10) Patent No.: US 6,559,736 B2
(45) Date of Patent: May 6, 2003

(54) INTEGRATED TUNABLE SURFACE ACOUSTIC WAVE WITH QUANTUM WELL STRUCTURE TECHNOLOGY AND SYSTEMS PROVIDED THEREBY

(75) Inventors: Yicheng Lu, East Brunswick, NJ (US); Nuri W. Emanetoglu, Woodbury, NJ (US)

(73) Assignee: Rutgers, The State University of New Jersey, Piscataway, NJ (US)

( * ) Notice: Subject to any disclaimer, the term of this patent is extended or adjusted under 35 U.S.C. 154(b) by 0 days.

(21) Appl. No.: 09/905,191

(22) Filed: Jul. 13, 2001

(65) Prior Publication Data

US 2002/0044028 A1 Apr. 18, 2002

Related U.S. Application Data

(60) Provisional application No. 60/217,899, filed on Jul. 13, 2000, provisional application No. 60/217,895, filed on Jul. 13, 2000, provisional application No. 60/217,894, filed on Jul. 13, 2000, and provisional application No. 60/217,893, filed on Jul. 13, 2000.

(51) Int. Cl.[7] ............................. H03H 9/42; H03H 9/38; H03H 9/64

(52) U.S. Cl. ..................... 333/152; 333/153; 333/193; 331/154; 257/14

(58) Field of Search ................................ 333/152, 153, 333/193; 331/107 A, 154; 257/14

(56) References Cited

U.S. PATENT DOCUMENTS

| | | | |
|---|---|---|---|
| 4,005,376 A | * | 1/1977 | Davis ........................ 333/152 |
| 4,401,956 A | * | 8/1983 | Joshi ........................ 333/152 |
| 4,683,395 A | * | 7/1987 | Mitsutsuka ............. 333/152 X |
| 4,697,115 A | * | 9/1987 | Mitsutsuka ............. 333/152 X |
| 5,101,294 A | * | 3/1992 | Jain et al. ................... 359/285 |
| 6,029,324 A | * | 2/2000 | Wixforth ................ 333/152 X |

OTHER PUBLICATIONS

M. Rotter et al., "Novel Concepts for GAAS/LINB03 Layered Systems and their Device Applications", IEEE Transactions on Ultrasonics, Ferroelectrics and Frequency Control, vol. 47, No. 1, Jan. 2000, pp. 242–248.

Emanetoglu, N. W. et al., "Epitaxial Growth and Characterization of High Quality ZNO Films for Surface Acoustic Wave Applications" Proceedings of the 1997 IEEE Ultrasonics Symposium, Ontario, Canada, Oct. 5–8, 1997, IEEE Ultrasonics Symposium Proceedings, New York, NY, IEEE, US, vol. 1, Oct. 5, 1997, pp. 195–199.

(List continued on next page.)

*Primary Examiner*—Barbara Summons
(74) *Attorney, Agent, or Firm*—Hoffmann & Baron, LLP

(57) ABSTRACT

A ZnO monolithically integrated tunable surface acoustic wave (MITSAW) device uses tunable acousto-electric and acouso-optic interaction between surface acoustic waves (SAW) and a two dimensional electron gas (2DEG) in a $ZnO/Mg_xZn_{1-x}O$ quantum well. The high electromechanical coupling coefficients of piezoelectric ZnO in conjunction with the low acoustic loss and high velocity of sapphire ($Al_2O_3$) offers high frequency and low loss RF applications. The 2DEG interacts with the lateral electric field resulting in ohmic loss which attenuates and slows the surface acoustic wave. This mechanism is used to tune the acoustic velocity. The high coupling coefficients offered by the ZnO/R—($Al_2O_3$) systems allows large velocity tuning. Combined with the optical characteristics of the wide and direct band gap (about 3.3 eV) semiconductor and transparent ZnO electrodes, the MITSAW chip can be used for UV optical signal processing. R-plane sapphire is chosen instead of the popular C-plane substrate, as this substrate provides in-plane anisotropy in the ZnO layer. ZnO MITSAW technology not only improves existing devices but also develops many important application areas, such as tunable/adaptive filters, voltage-controlled oscillators, zero-power remote wireless sensors, and fixed and tunable UV optical delay lines.

12 Claims, 6 Drawing Sheets

OTHER PUBLICATIONS

Rotter, M. et al., "Voltage Controlled Saw Velocity in GAAS/LINB0–Hybrids" IEEE Transactions on Ultrasonics, Ferroelectrics and Frequency Control, IEEE Inc., New York, US, vol. 46, No. 1, Jan. 1999, pp. 120–125.

Streibl, M. et al., "Novel Optoelectronic Signal Processing via the Combination of Saw and Semiconductor Heterostructures", 1998 IEEE Ultrasonics Symposium Proceedings, Sendai, Miyagi, JP, Oct. 5–8, 1998, IEEE Ultrasonics Proceedings, New York, NY, IEEE, US., vol. 1, Oct. 5, 1998, pp. 107–110.

* cited by examiner

INTEGRATED TUNABLE SURFACE ACOUSTIC WAVE WITH QUANTUM WELL STRUCTURE TECHNOLOGY AND SYSTEMS PROVIDED THEREBY

CROSS-REFERENCE TO RELATED APPLICATIONS

This application claims priority to Provisional Application Serial No. 60/217,899, filed on Jul. 13, 2000 and entitled "Voltage Controlled Oscillator Using ZnO Based Tunable Surface Acoustic Wave Device", Provisional Application Serial No. 60/217,895, filed on Jul. 13, 2000 and entitled "Adaptive and Tunable Filters Using ZnO Based Tunable Surface Acoustic Wave Device", Provisional Application Serial No. 60/217,893, filed on Jul. 13, 2000 and entitled "Zero-Power Remote Wireless Sensor Using ZnO Based Tunable Surface Acoustic Wave Device" and Provisional Application Serial No. 60/217,894, filed on Jul. 13, 2000 and entitled "Fixed and Tunable UV Optical Delay Lines Using Acousto-Opto-Electronic Interaction in ZnO/$Mg_xZn_{1-x}O$ Heterostructure".

FIELD OF THE INVENTION

This invention relates generally to tunable surface acoustic wave technology and pertains more particularly to ZnO based monolithically integrated tunable surface acoustic wave (MITSAW) technology and electronic and photonic systems employing MITSAW devices.

BACKGROUND OF THE INVENTION

Basic SAW Technology

SAW devices have been widely used for signal processing since 1964, when the interdigital transducer (IDT) was introduced. The basic principle of a SAW device is to apply an input IDT and an output IDT in mutually spaced relation to a piezoelectric member, to apply an electrical signal to the input IDT, thereby causing a surface acoustic wave to propagate in the piezoelectric member, and to obtain the electrical signal generated in the output IDT by the propagated surface acoustic wave. The time for the propagated wave to travel from its generation at the input IDT to its arrival at the output IDT constitutes a time delay and the piezoelectric member constitutes a delay path.

Tunable SAW Technology Using Quantum Well

A problem in SAW technology to date has been the lack of tunability of acoustic velocity, which would allow tuning of the center frequency of the SAW filters. A conductive element near the piezoelectric surface changes the acoustic velocity by coupling with the electric fields of the acoustic wave. Ideally, tunability of the acoustic velocity is limited by the electromechanical coupling coefficient of the piezoelectric material. Early attempts include the use of a semiconductor film in close proximity to the piezoelectric surface. The variable finite conductivity of the semiconductor interacts with the electric fields associated with the acoustic wave, and slows the wave. An improved approach is to use a two dimension electron system (2DES) to tune the acoustic velocity.

More particularly, the acoustic velocity of the propagated surface acoustic wave is controlled by changing the conductivity of the 2DES through reverse biasing of the quantum well. When the quantum well is depleted, the acoustic wave propagates at the near open-circuit velocity of the piezoelectric layer and its underlying substrate system. On the other hand, when the quantum well is forward biased, the acoustic velocity approaches short-circuit velocity.

In this reported device, a GaAs substrate was used as a piezoelectric medium, and the 2DES was formed in an $Al_xGa_{1-x}As$ quantum well. As the piezoelectric coupling of GaAs is very small, the reported tunability range was <0.1%. An alternative hybrid GaAs—$LiNbO_3$ device where the 2DES was formed in a GaAs quantum well, which was epitaxially lifted off, and bonded to the $LiNbO_3$ substrate. The effective coupling coefficient of this structure was reported to be 3.5% and a velocity tunability of 1.5% was reported. However, the epitaxial liftoff technology is very complicated, with low. yields and poor reliability; therefore, it is unsuitable for commercial applications.

SAW Filters

A known SAW filter includes a piezoelectric layer disposed on an underlying substrate, an input IDT and an output IDT A varying electrical signal source applies signals to the input IDT and a load is connected to the output IDT 16.

Modern communications systems are increasingly moving to higher data rates to accommodate the demand for enhanced capabilities, such as data and multimedia communications. Coupled with an expanding user base, this increasing data rate translates to larger bandwidths and higher frequencies in the engineering requirements. High frequency, low loss, low power, miniaturized and integrated filters, for example, are required for the exponentially expanding wireless communications industry. As multifunctional systems are deployed, adaptive and programmable filters are needed.

While digital filter technology is advanced, digital signalprocessors consume high power, are limited to the lower end of the frequency spectrum, being subject to circuit speed limitations and their performance is dependent on the analog preprocessing and post-processing circuits. Analog devices and circuits, which can achieve the aims of high frequency, low loss, low power, miniaturized and adaptive filtering, are needed as low cost, light weight, high performance alternatives.

SAW devices have been widely used in communications systems. They are easy to fabricate and are low cost, light weight, and very versatile devices. High performance filter specifications can be realized, using space-domain sampling, as opposed to time domain sampling in digital techniques. Very complex filter functions can be implemented, with independent design of frequency and phase response.

The major limitation of conventional SAW filters is that their frequency and phase response is set at the time of their design, and cannot be changed during operation. However, in many modem communication systems adaptive signal processing is desired for increased signal to noise performance, and security concerns. Further, tunability of the time or frequency domain response is desirable for the communications system to adapt to its operating environment.

Two distinct types of surface acoustic wave filters have emerged to meet these demands. The first type is the programmable SAW filter, which changes the filter parameters such as center frequency, band width, and pass band shape. This type of SAW device includes filter banks, multiple interdigital transducer (IDT) filters and electrode configurable devices. The second type of SAW filter was created to meet the tunability demands. Early designs were based on the voltage-controlled width of a depletion layer in a semiconductor bulk diode applied, with the input and output IDTs to the piezoelectric member. However, the current programmable SAW filters are large in size, complex and costly with relatively high insertion loss, which render them unsuitable for many applications.

SAW Voltage Controlled Oscillators

In providing SAW voltage controlled oscillators, the art has typically placed a SAW device in a feedback path, e.g., connecting one SAW IDT to the input terminal of an amplifier and connecting the output terminal of the amplifier to the other SAW IDT.

The frequency tuning range of the voltage controlled oscillator (VCO), which is built on the given piezoelectric material, is inversely proportional to the delay time of the SAW device. The shorter the delay time of the SAW, the higher is the frequency tuning range. Heretofore known SAW VCOs are seen as either having a less than desired operating frequency and frequency tuning range due to small electromechanical coupling coefficients and low acoustic velocity, such as GaAs/$Al_xGa_{1-x}As$ devices, or having complicated structures with low yields and poor reliability due to the hybrid processing technology, such as GaAs—$LiNbO_3$.

Zero-power Remote SAW Wireless Sensors

Zero-power passive wireless sensors are important for environmental monitoring and identification applications. Their principle advantage is that they do not need a power source, as they derive energy from an interrogation signals. They are particularly attractive for hazardous environments, such as interiors of engines, chemical reaction chambers, high-voltage lines and the like.

Presently there are two known types of zero-power passive SAW wireless sensors. The first type consists of GaAs/$Al_xGa_{1-x}As$ quantum well and SAW structures, which are seen having very small electromechanical coupling coefficients with accompanying low acoustic velocity, resulting in a small dynamic range for wireless sensor read-out. The second type, which consists of GaAs/$LiNbO_3$ hybrid structure, suffers from low yields, poor reliability and high cost due to complicated bonding technology.

SAW Optical Delay Lines

The optical delay line technology is used for optical signal processing. Presently known and cost-effective SAW optical delay lines also suffer from the limitation of less than desired electromechanical coupling coefficients. They are further limited in frequency of operation, not operable in the ultraviolet (UV) range.

As TV range lasers are developed, optical signal processing devices operating in this range will be needed, e.g., optical multiplexers, demultiplexers, modulators, delay lines and the like.

Zinc oxide and its Related Compounds

Zinc oxide is a versatile semiconductor material, with a wide and direct energy band gap (circa 3.3 eV). It has an exciton binding energy ($E_b$) of 60 meV, which is 2.4 times the thermal energy at room temperature. The large $E_b$ implies that electron-hole pairs are well bound even at room temperature, and efficient radiative recombination is possible if non-radiative recombination sites caused by crystal defects can be reduced by improving the quality of the film. Recently, ZnO has been used for visible-blind UV photo-detectors. Optically pumped laser emission has been observed in ZnO films. This opens up the possibility of developing UV lasers from ZnO films. ZnO based ternary alloys, $Mg_xZn_{1-x}O$, have been demonstrated, allowing band gap engineering from 2.8 eV to 4.0 eV. In comparison with other wide band gap emiconductors, ZnO can be grown in the 300 degrees centigrade to 450 degrees centigrade range, hundreds of degrees lower than GaN, "a cool way to beat blue".

ZnO films have recently been used as the substrate or buffer layer for the growth of GaN based optoelectronic devices. The lattice mismatch between GaN and ZnO is relatively small, which makes growth of high quality films possible. ZnO/GaN heterostructures have been used for hybrid opto-electronic devices. GaN films grown on high quality ZnO buffer layers (grown on C—($Al_2O_3$)) have been observed to have better structural properties compared to GaN films grown on sapphire and SiC.

ZnO is well known as a piezoelectric material used in bulk acoustic wave (BAW) and surface acoustic wave (SAW) delay lines, filters and resonators in wireless communication and signal processing. ZnO thin films have been used in conjunction with low loss high acoustic velocity substrates, such as sapphire ($Al_2O_3$) and diamond; with semiconductors, such as Si, GaAs and InP; and with low coupling coefficient piezoelectric materials, such as quartz. ZnO thin films deposited on GaAs and on InP are also used for acousto-optic modulators.

MOCVD Technology

The key issue for high performance, thin film ZnO based SAW device fabrication is the control of the film quality. Many growth technologies have been used to grow ZnO films. Among them, MOCVD (metal organic chemical vapor deposition) technology offers the advantages of high quality epitaxial growth on large area substrates in a production scale.

Applicants herein have used an MOCVD system with a rotating disc reactor chamber. ZnO epitaxial films are grown, using DEZn as the zinc precursor and oxygen as the oxidizer. The gas phase reaction between DEZn and oxygen can occur at room temperature and results in particulate formation, which degrades ZnO film properties, including surface morphology and crystallinity. In order to minimize the gas phase reaction, the MOCVD reactor is designed to have a flow-top configuration with high nitrogen push flow. DEZn and oxygen are introduced into the reactor separately. The substrate is rotated at high speed for improving thickness uniformity.

SUMMARY OF THE INVENTION

The present invention has as its primary object to provide ZnO based monolithically integrated tunable SAW (MITSAW) devices having a ZnO/$Mg_xZn_{1-x}O$ quantum well structure.

In attaining the primary and other objects, the invention provides a family of electronic and photonic devices with improved operational characteristics and manufacturability.

The basic MITSAW device of the invention includes a piezoelectric member, input and output IDTs disposed on a surface of the piezoelectric member, and a quantum well structure also disposed on a surface of the piezoelectric member.

The piezoelectric member is comprised of zinc oxide. The quantum well structure is composed of the binary semiconductor of zinc oxide (ZnO) and the ternary semiconductor of magnesium zinc oxide ($Mg_xZn_{1-x}O$). A substrate is provided for deposition of the piezoelectric member and is comprised of R-plane sapphire.

The MITSAW device is built using R-plane sapphire substrate instead of the popular C-plane sapphire, which offers unique advantages; (i) the c-axis of the ZnO film in the ZnO/R—($Al_2O_3$) material system is in-plane, resulting with electrical, piezoelectric and optical anisotropy for novel applications; (ii) certain wave modes in the ZnO/R—($Al_2O_3$) material system have large coupling coefficients and low loss compared to the $GaAs/Al_xGa_{1-x}As$ material system, which significantly enhances the tunability of the acoustic velocity; and (iii) lattice mismatch between., ZnO and R-plane sapphire is less than that between ZnO and C-plane sapphire, resulting in high quality ZnO thin films.

In a first electronic system aspect, the invention provides a voltage controlled oscillator (VCO) employing a ZnO based MITSAW structure as above described.

In a second electronic system aspect, the invention provides an adaptive and tunable filter employing a ZnO MITSAW structure as above described.

In a third electronic system aspect, the invention provides a zero-power remote wireless sensor employing a ZnO MITSAW structure described above as a tunable delay line which is used as a readout element.

In a fourth system aspect, the invention provides a photonic system having respective fixed and tunable UV optical delay lines using acousto-opto-electronic interaction in the ZnO MITSAW device as above described.

The foregoing and other objects and features of the invention will be further understood from the following detailed description of the preferred embodiments and practices and from the drawings.

DETAILED DESCRIPTION OF THE PREFERRED EMBODIMENTS AND PRACTICES

Figure 1:
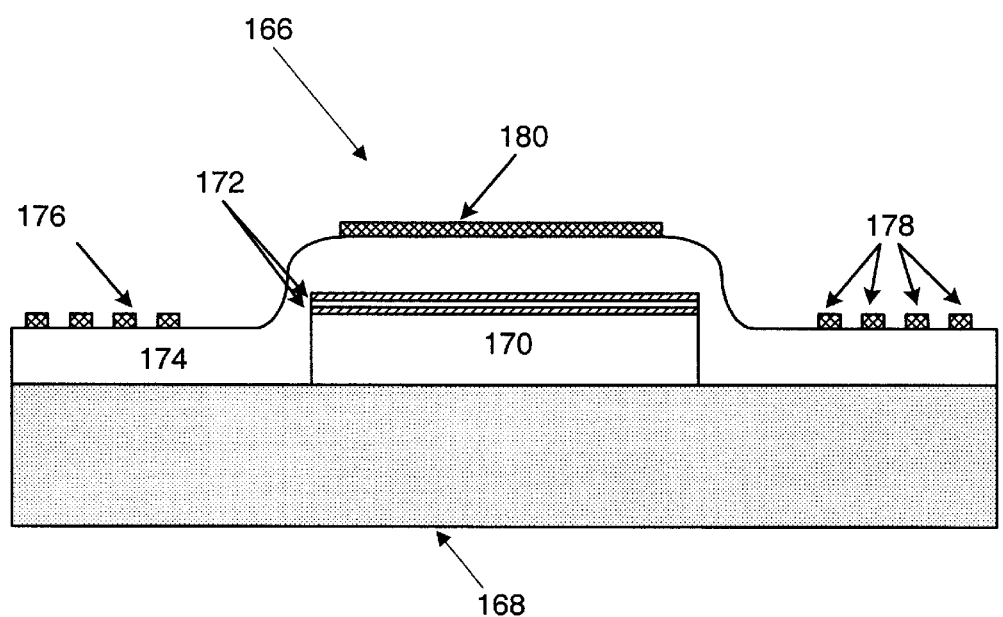
FIG. 1 is a schematic showing of a ZnO based monolithically integrated tunable SAW device of the invention.

Turning to FIG. 1, monolithically integrated tunable SAW device 166 of the invention includes R-plane sapphire substrate 168, on which first ZnO layer 170 is centrally disposed. Quantum well structure 172 is disposed atop layer 170. Second ZnO layer 174 (piezoelectric) is disposed both on substrate 168 and on quantum well structure 172. IDTs 176 and 178 are disposed on second ZnO layer 174 as is electrode 180. The magnesium zinc oxide ($Mg_xZn_{1-x}O$) layer, which has x composition of Mg and 1−x composition of Zn in the ternary semiconductive compound, is lightly doped to provide the electrons for the 2DES. An important parameter for the magnesium zinc oxide layer is the Mg composition ratio (x) in the ternary compound. This determines the band offset, which determines the threshold voltage of the 2DES system, as well as the electron confinement in the quantum well.

The signal applied to IDT 176 propagates a surface acoustic wave in SAW device 166. The 2DES in quantum well structure 172 interacts with the lateral electric field of the propagated surface acoustic wave resulting in ohmic loss and a slowing of the wave. More particularly, the acoustic velocity is controlled by changing the conductivity of the 2DES through reverse biasing of the quantum well by signals applied to electrode 180. When the quantum well is depleted, the acoustic wave propagates at the near open-circuit velocity of the zinc oxide/sapphire system. When the quantum well is forward biased the acoustic velocity approaches short-circuit velocity.

By way of further explanation of the invention and introduction to the family of systems below discussed. The high electromechanical coupling coefficients of piezoelectric ZnO in conjunction with the low acoustic loss and high velocity of sapphire ($Al_2O_3$) offers high frequency and low loss RF applications. Alloying ZnO with MgO forms the ternary compound $Mg_xZn_{1-x}O$, which permits band gap tuning from 3.32 eV to 4 eV. $ZnO/Mg_xZn_{1-x}O$ heterostructures with 2DES are integrated with SAW to create the unique acoustic velocity tuning mechanism of the invention. Combined with the optical characteristics of the wide and direct band gap (circa 3.3 eV) semiconductor ZnO and transparent conductive ZnO electrodes, such device structure can be used for UV optical signal processing. R-plane sapphire, on which the quantum well structure is grown using MOCVD, is chosen instead of the popular C-plane substrate since R-plane sapphire provides in-plane anisotropy in the ZnO layer. By aligning the device parallel to the c-axis of the ZnO film, Rayleigh type surface acoustic waves are excited, while Love type surface acoustic waves are excited when the devices are aligned perpendicular to the c-axis.

The current material system ($ZnO/Mg_xZn_{1-x}O$) can be extended to other high electromechanical coupling SAW quantum well structures, such as $GaN/Al_xGa_{1-x}N$. In addition to MOCVD, other growth technologies may be used, such as MBE (molecular beam epitaxy) and PLD (pulse laser deposition), for providing such MITSAW structures.

Figure 2:
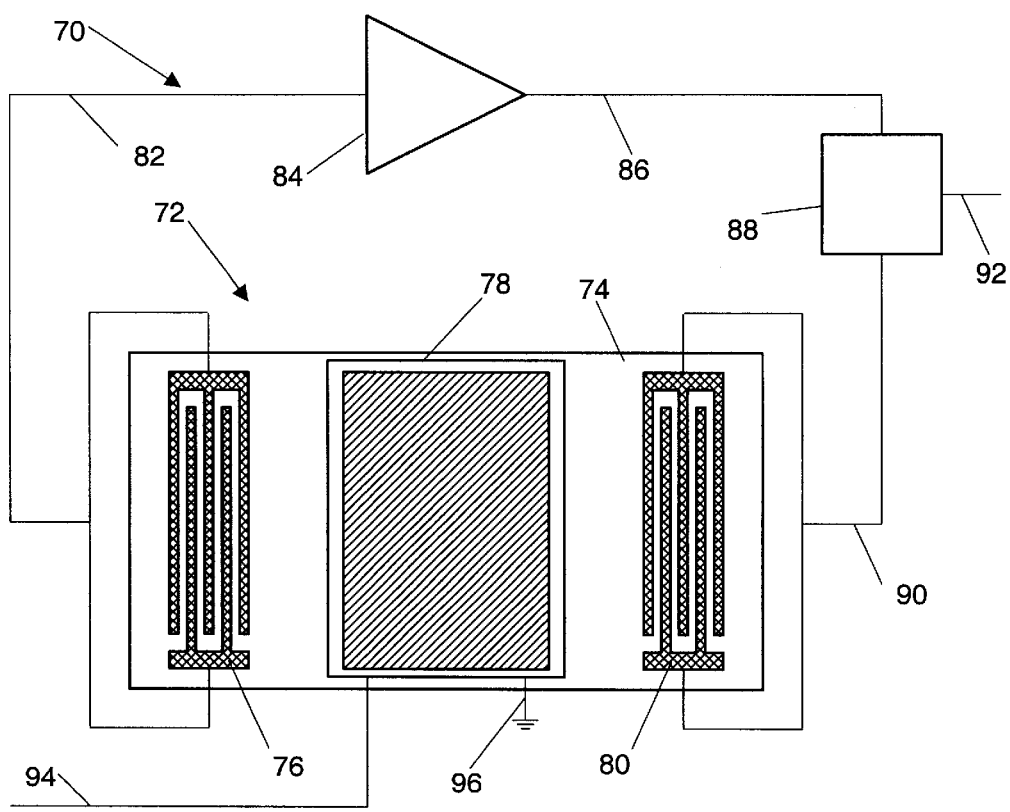
FIG. 2 is a schematic showing of a first embodiment of an electronic system employing an integrated tunable SAW device in accordance with the invention, namely, a voltage controlled oscillator.

Referring to FIG. 2, voltage controlled oscillator 70 includes a SAW device 72 in accordance with the invention. SAW device 72 has a substrate (not shown) on which is disposed piezoelectric layer 74. Disposed on layer 74 are IDT 76, quantum well structure 78 and IDT 80. IDT 76 is connected by line 82 to the input of amplifier 84 and the output of amplifier 84 is connected by line 86 to power divider 88, which is connected by line 90 to IDT 80. The output of oscillator 70 is provided on output line 92 of power divider 88.

SAW device 72 constitutes a delay line in the feedback path of oscillator 70 and the oscillator is tunable by applying a gate voltage over line 94 to one electrode of quantum well structure 78, the other electrode of which is connected by line 96 to electrical ground.

Figure 3:
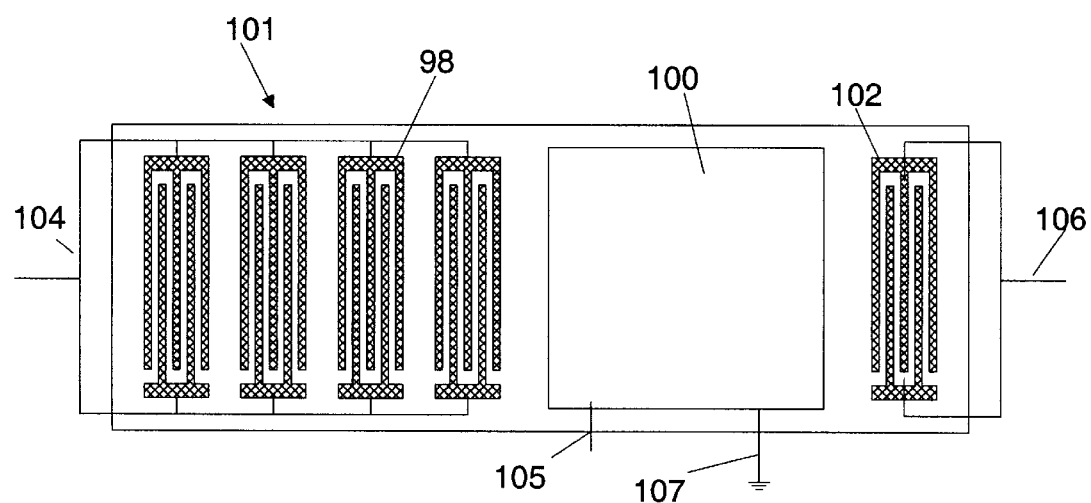
FIG. 3 is a schematic showing of a second embodiment of an electronic system employing the SAW device in accordance with the invention, namely, a tunable filter.

Turning to FIG. 3, tunable filter 101 is constituted by a SAW device constructed in accordance with the invention and comprising substrate (not shown) on which is disposed piezoelectric layer 103. Disposed on layer 103 is IDT 98, quantum well structure 100 and IDT 102. An input electrical signal to be delayed is applied over lines 104 to IDT 98 and an electrical signal delayed by the delay in the SAW device is provided on lines 106 from IDT 102. Control line 105 is connected to one electrode of quantum well structure 100 and the other electrode thereof is connected by line 107 to electrical ground.

Figure 4:
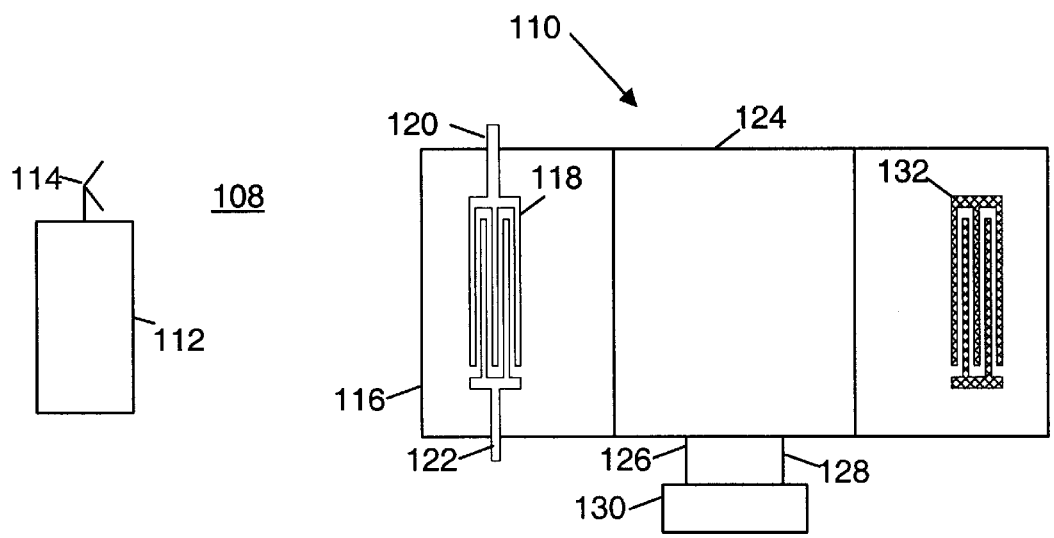
FIG. 4 is a schematic showing of a third embodiment of an electronic system employing the SAW device in accordance with the invention, namely, a remote sensor and remote sensor system.

Referring to FIG. 4, remote sensor system 108, includes SAW device 110 and transmitter/receiver 112 having antenna 114. SAW device 110 comprises a substrate (not shown) on which is disposed piezoelectric layer 116. IDT 118, disposed on piezoelectric layer 116, is configured to have antenna parts 120 and 122 extending outwardly thereof. Quantum well structure 124 is disposed on layer 116 and its electrodes are connected to lines 126 and 128, which are connected to sensor 130. SAW reflector array 132 is adjacent the quantum well structure and is disposed on layer 116.

In operation of system 108, transmitter/receiver 112 furnishes an interrogation signal to antenna 114. This signal is transmitted to and excites IDT 118, launching a SAW in layer 116. The SAW travels under the 2DES of quantum well structure 124 and to reflector array 132, whence the SAW is reflected and again travels under the 2DES.

The 2DES interacts with the lateral field of the SAW, resulting in ohmic loss, which attenuates and slows the SAW. This mechanism is used to tune the acoustic velocity.

As the voltage output of sensor 130 changes, the 2DES concentration will change. This will reflect as an increase or decrease of the SAW velocity, and a corresponding increase or decrease in the delay time.

When the SAW reaches IDT 118, it excites an electrical signal, which is then converted to an electromagnetic wave by the antenna parts of IDT 118. This signal is received by antenna 114 and measurement is made of the time delay between the transmission of the interrogating signal and the received signal. The measured time delay corresponds to the output of sensor 130.

Figure 5:
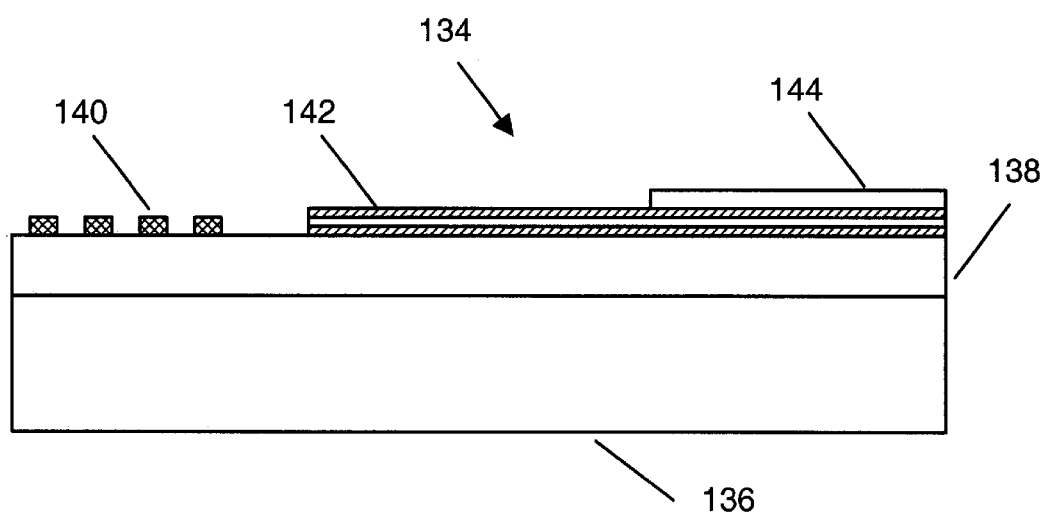
FIG. 5 is a schematic showing of a first photonic system employing the SAW device in accordance with the invention, namely, a fixed length optical delay.

Referring to FIG. 5, optical delay line system 134 comprises substrate 136 (sapphire) on which is disposed piezoelectric (ZnO) layer 138. IDT 140 is disposed on layer 138 as is quantum well structure 142. A thin transparent electrode (ZnO) 144 is disposed on quantum well structure 142.

In operation of system 134, a SAW is launched from IDT 140 and enters the 2DES of quantum well structure 142. An ultraviolet (UV) signal is focused at a point in the 2DES. Due to the absorption of the UV photons, electron-hole pairs disassociate and are trapped in the hills and valleys of the periodic potential which accompanies the propagating SAW. These dynamically-trapped electron-hole pairs are transported over macroscopic distances, as they propagate with the SAW. Radiated recombination is induced after long storage times by deliberate screening of the lateral piezoelectric fields. The radiative recombination is effected in system 134 in that the transparent ZnO electrode shorts out the electric field and the electron-hole pairs recombine radiatively.

The optical delay, which is of fixed length, is determined by the distance between IDT 140 and transparent zinc oxide electrode 144. The system can operate in both continuous and packet modes.

Figure 6:
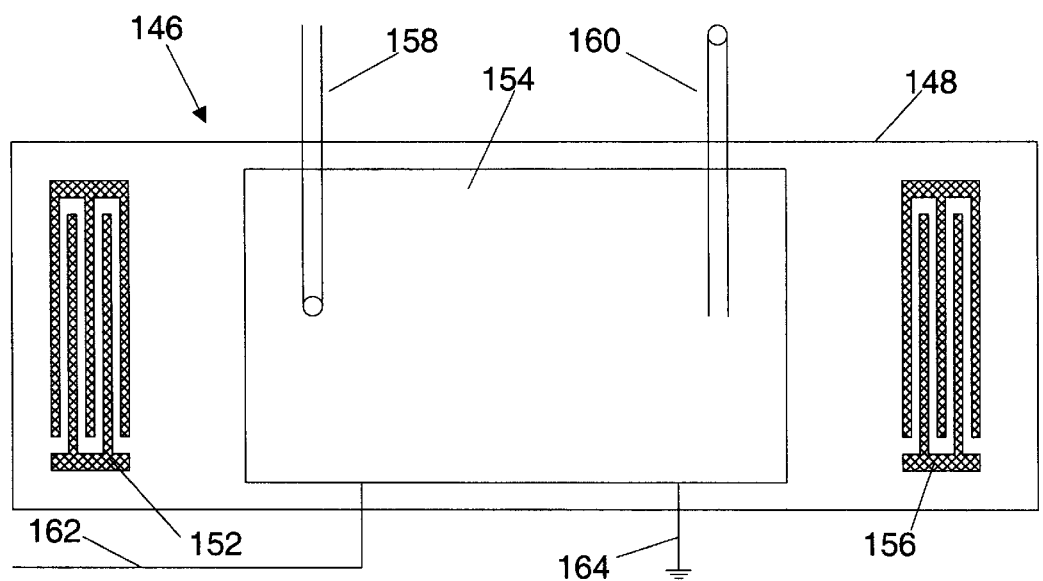
FIG. 6 is a schematic showing of a second photonic system employing the SAW device in accordance with the invention, namely, a variable length optical delay.

Turning to FIG. 6, a further optical delay line system 146 in accordance with the invention includes a substrate (not shown) on which is disposed piezoelectric (ZnO) layer 148. IDT 152 is disposed on layer 148 as is quantum well structure 154 and IDT 156. Optical input and output guides 158 and 160 are in registry with quantum well structure 154, electrodes thereof being connected to lines 162 and 164, which is connected to electrical ground.

The physical underpinnings of optical delay line system 146 are the same as those of optical delay line system 134 of FIG. 5 i.e., absorption of UV photons, dissociation of electron-hole pairs and trapping thereof in the hills and valleys of the periodic potential which accompanies the propagating SAW generated at IDT 152, etc. However, in system 146, a counterpropagating SAW packet, launched from IDT 156, destructively recombines with the other propagating SAW from IDT 152 to release the electron pairs. The counterpropagating SAW is timed such that it meets and nullifies the other propagating SAW at a predetermined distance. The UV is conducted through optical guide 158 and the radiative recombination issues from optical guide 160.

As will be appreciated from the foregoing, the invention provides for monolithic integration using piezoelectric ZnO and semiconductor $ZnO/Mg_xZn_{1-x}O$ in contrast to hybrid SAW devices using complicated bonding techniques. The interaction with propagated surface acoustic waves with a 2DES in a monolithic integrated ZnO/MgZnO system provides SAW tunability. Furthermore, the R-plane sapphire is chosen instead of the popular C-plane sapphire as a substrate. The structure provides in-plane anisotropy of electrical, acoustical and optical properties in the ZnO layer, which result in many novel applications. The $ZnO/(Al_2O_3)$ structures have large coupling coefficients and low acoustic loss, which benefits the high frequency operation and enhances the tunability of the acoustic velocity. The ZnO-based system incorporates aspects of semiconductivity, piezoelectricity, transparency and conductivity. Advantage is also taken of the unique optical properties of ZnO, such as wide and direct UV energy band gap. The ZnO-based technology provides a broad series of electronic and photonic devices as above detailed.

Various changes may be introduced in the disclosed preferred embodiments and practices without departing from the invention. Accordingly, it is to be appreciated that the true spirit and scope of the invention is set forth in the following claims.

What is claimed is:

1. An integrated multi-mode tunable SAW device comprising a piezoelectric member comprised of zinc oxide, at least a first DDT disposed on a surface of said piezoelectric member, a quantum well structure comprised of a zinc oxide and magnesium oxide heterostructure, engaging said piezoelectric member in a SAW path, an R-plane sapphire substrate on which said piezoelectric member is disposed, and an electrode disposed on said quantum well structure and on said piezoelectric member.

2. The integrated multi-mode tunable SAW device claimed in claim 1, wherein said electrode is a patterned metal layer controlling electron conductivity in said quantum well structure.

3. The integrated multi-mode tunable SAW device claimed in claim 1, wherein said R-plane sapphire substrate provides in-plane anisotropy in said piezoelectric member.

4. The integrated multi-mode tunable SAW device claimed in claim 1, wherein said quantum well structure comprises $ZnO/Mg_xZn_{1-x}O$ monolithically integrated on said substrate through a crystal growth technique.

5. The integrated multi-mode tunable SAW device claimed in claim 4 wherein said crystal growth technique is MOCVD.

6. A voltage-controlled oscillator, comprising the integrated multi-mode tunable SAW device claimed in claim 1 including a second IDT, an oscillator circuit being formed by said first IDT and said second IDT; whereby said piezoelectric member defines a tunable delay line in a feedback path of said oscillator.

7. An adaptive and tunable filter, comprising the integrated multi-mode tunable SAW device claimed in claim 1, said electrode controlling filter center frequency, bandwidth, bandshape and time delay control.

8. A zero-power remote wireless sensor system, comprising the integrated multi-mode tunable SAW device claimed in claim 1 including a further electrode for said quantum well structure, wherein said first IDT is connected to an antenna and is situated at a first side of said quantum well structure, a SAW reflector being situated at a second side of said quantum well structure, and a sensor connected to the electrodes and generating an electrical signal across the electrodes.

9. A fixed UV optical delay line operable in continuous wave and packet modes, comprising the integrated multi-mode tunable SAW device claimed in claim 1, wherein said first electrode is transparent and is disposed on said quantum well structure at a spacing from said first IDT, wherein the optical delay of said delay line is determined by the spacing between said transparent electrode and said first IDT.

10. The fixed UV optical delay line comprising the integrated multimode tunable SAW device as claimed in claim 9, wherein said optical delay is achieved when an optical signal is focused close to a side of said quantum well structure closest to said first IDT, said optical signal generating electron-hole pairs which are in turn trapped in the potential wells of a propagating surface acoustic wave launched from said first IDT, and after travelling in the quantum well structure combine under said transparent electrode to regenerate said optical signal, thus providing a predetermined optical delay.

11. A tunable optical delay line operable in packet mode, comprising a piezoelectric member, a first IDT and a second IDT disposed on a surface of said piezoelectric member, a quantum well structure engaging said piezoelectric member in a SAW path, a substrate for said piezoelectric member.

12. The tunable optical delay line claimed in claim 11 which the optical delay is achieved when an optical signal is focused close a first side of said quantum well, which generates electron-hole pairs which in turn are trapped in the potential wells of a propagating surface acoustic wave launched from IDT closest to first side of said quantum well, and after travelling in said quantum well combine when they collide with a counter-propagating surface acoustic wave launched from the second IDT, regenerating the optical signal and thus providing the optical delay, and the optical delay time is determined by the time in which the counter propagating surface acoustic wave packet is launched.

* * * * *

UNITED STATES PATENT AND TRADEMARK OFFICE
CERTIFICATE OF CORRECTION

PATENT NO.    : 6,559,736 B2
DATED         : May 6, 2003
INVENTOR(S)   : Lu et al.

It is certified that error appears in the above-identified patent and that said Letters Patent is hereby corrected as shown below:

Column 2,
Line 54, delete "...many modem communication systems...", and insert -- ...many modern communication systems... --

Column 3,
Line 53, delete "...as TV range lasers...", and insert -- ...as UV range lasers... --

Column 8,
Line 9, delete "...system 134 of Fig. 5...", and insert -- system 134 of Fig. 7... --.
Line 47, delete "...a first DDT...", and insert -- ...a first IDT... --.

Signed and Sealed this

Twenty-third Day of September, 2003

JAMES E. ROGAN
*Director of the United States Patent and Trademark Office*